(12) United States Patent
Adams et al.

(10) Patent No.: US 7,400,550 B2
(45) Date of Patent: Jul. 15, 2008

(54) DELAY MECHANISM FOR UNBALANCED READ/WRITE PATHS IN DOMINO SRAM ARRAYS

(75) Inventors: Chad Allen Adams, Byron, MN (US); Anthony Gus Aipperspach, Rochester, MN (US); Derick Gardner Behrends, Rochester, MN (US); George Francis Paulik, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/560,428

(22) Filed: Nov. 16, 2006

(65) Prior Publication Data

US 2008/0117695 A1   May 22, 2008

(51) Int. Cl.
*G11C 8/00* (2006.01)
(52) U.S. Cl. ............... 365/230.06; 365/154; 365/189.05
(58) Field of Classification Search ............... 365/154, 365/156, 189.01, 189.05, 194, 230.06, 230.08
See application file for complete search history.

(56) References Cited

U.S. PATENT DOCUMENTS

| | | | |
|---|---|---|---|
| 5,668,761 A | 9/1997 | Muhich et al. | |
| 5,729,501 A | 3/1998 | Phillips et al. | |
| 5,737,270 A | 4/1998 | Oppold et al. | |
| 6,058,065 A | 5/2000 | Lattimore et al. | |
| 6,563,759 B2 * | 5/2003 | Yahata et al. | ............... 365/233 |
| 6,608,797 B1 | 8/2003 | Parris et al. | |
| 6,657,886 B1 | 12/2003 | Adams et al. | |
| 6,833,736 B2 | 12/2004 | Nakazato et al. | |
| 2003/0140080 A1 | 7/2003 | Friend et al. | |
| 2006/0176728 A1 | 8/2006 | Palella | |
| 2006/0176729 A1 | 8/2006 | Chan et al. | |
| 2006/0176730 A1 | 8/2006 | Chan et al. | |
| 2006/0176753 A1 | 8/2006 | Chan et al. | |

* cited by examiner

*Primary Examiner*—Gene N. Auduong
(74) *Attorney, Agent, or Firm*—Matthew J. Bussan (57) ABSTRACT

A memory system, e.g., a domino static random access memory (SRAM), includes a plurality of memory cells and a wordline decoder coupled to the memory cells through wordlines. The wordline decoder provides a wordline signal to one or more memory cells over the wordlines to allow access to the memory cell(s) for a read operation or a write operation. Read_wl and write_wl signals are generated by the wordline decoder based on whether a read or a write operation is to be performed in the next cycle. The wordline decoder includes a buffer having an input for receiving the write_wl signal and an output for outputting a delayed version of the write_wl signal. The wordline signal is activated by the wordline decoder based on the read_wl signal and the delayed write_wl signal. This overcomes the "early read" problem in which write performance is degraded due to a fast read path.

3 Claims, 11 Drawing Sheets

DELAY MECHANISM FOR UNBALANCED READ/WRITE PATHS IN DOMINO SRAM ARRAYS

BACKGROUND OF THE INVENTION

1. Field of Invention

The present invention relates in general to the digital data processing field. More particularly, the present invention relates to semiconductor memories within digital data processing systems.

2. Background Art

In the latter half of the twentieth century, there began a phenomenon known as the information revolution. While the information revolution is a historical development broader in scope than any one event or machine, no single device has come to represent the information revolution more than the digital electronic computer. The development of computer systems has surely been a revolution. Each year, computer systems grow faster, store more data, and provide more applications to their users.

A modern computer system typically comprises at least one central processing unit (CPU) and supporting hardware, such as communications buses and memory, necessary to store, retrieve and transfer information. It also includes hardware necessary to communicate with the outside world, such as input/output controllers or storage controllers, and devices attached thereto such as keyboards, monitors, tape drives, disk drives, communication lines coupled to a network, etc. The CPU or CPUs are the heart of the system. They execute the instructions which comprise a computer program and direct the operation of the other system components.

The overall speed of a computer system is typically improved by increasing parallelism, and specifically, by employing multiple CPUs (also referred to as processors). The modest cost of individual processors packaged on integrated circuit chips has made multiprocessor systems practical, although such multiple processors add more layers of complexity to a system.

From the standpoint of the computer's hardware, most systems operate in fundamentally the same manner. Processors are capable of performing very simple operations, such as arithmetic, logical comparisons, and movement of data from one location to another. But each operation is performed very quickly. Sophisticated software at multiple levels directs a computer to perform massive numbers of these simple operations, enabling the computer to perform complex tasks. What is perceived by the user as a new or improved capability of a computer system is made possible by performing essentially the same set of very simple operations, using software having enhanced function, along with faster hardware.

Among such faster hardware is static random access memory (SRAM) which is typically faster than dynamic random access memory (DRAM). Accordingly, SRAM is frequently used where speed is a primary consideration such as in CPU caches and external caches. One type of SRAM known in the art is high performance domino SRAM. For example, U.S. Pat. No. 5,668,761, entitled "FAST READ DOMINO SRAM", issued on Sep. 16, 1997 to Muhich et al., and assigned to IBM Corporation, discloses a high performance domino SRAM and is hereby incorporated herein by reference in its entirety.

A domino SRAM combines an SRAM with a dynamic circuit known as a "domino circuit". To clarify that dynamic circuits are different than dynamic type memories, such as DRAMs, dynamic circuits are referred to herein as domino circuits or logic. In general, domino logic is a circuit design technique that makes use of dynamic circuits, and has the advantage of low propagation delay (i.e., these are fast circuits) and smaller area (i.e., due to fewer transistors). In domino logic, dynamic nodes are precharged during a portion of a clock cycle and conditionally discharged during another portion of the clock cycle, where the discharging performs the logic function.

Figure 1:
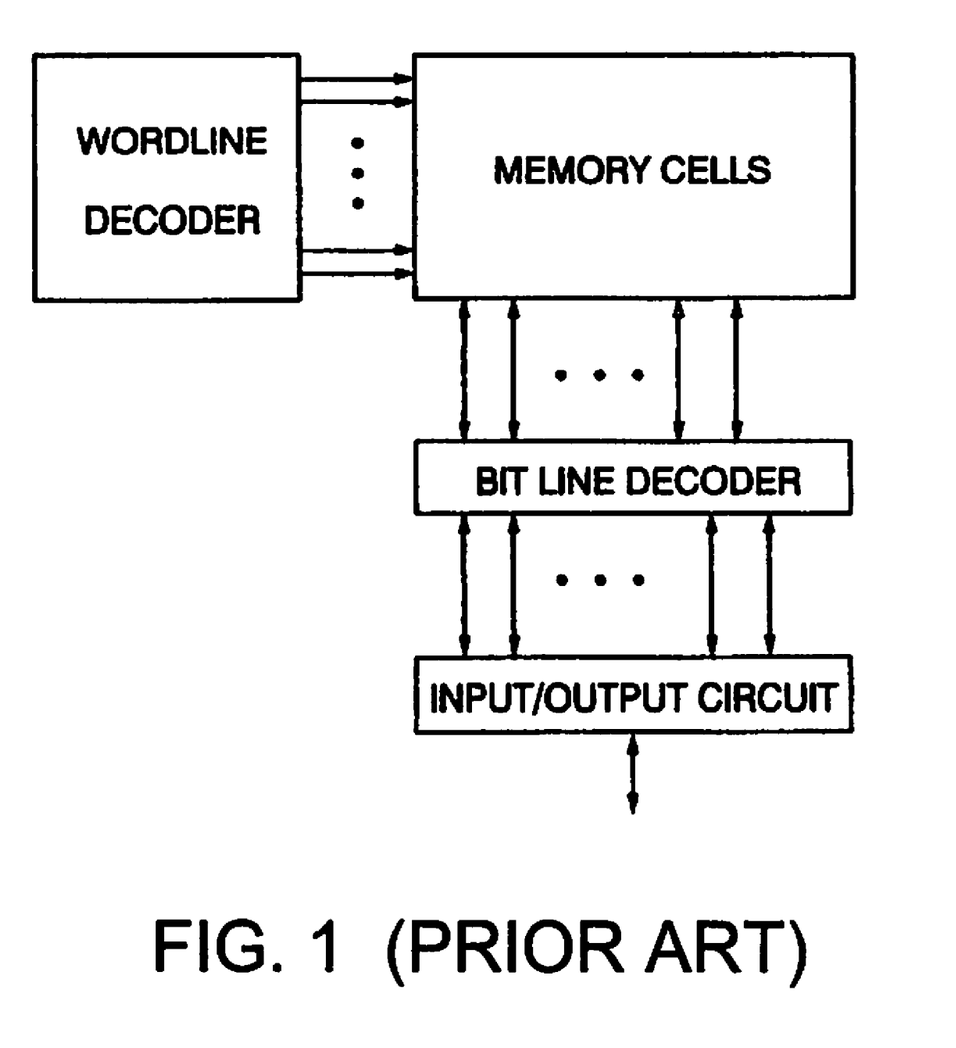
FIG. 1 is a block diagram illustrating a conventional memory system.

FIG. 1 illustrates a conventional memory system. The memory system comprises a wordline decoder, a plurality of semiconductor memory cells, a bitline decoder, and an input/output circuit. In general, a memory system typically includes a memory cell array that has a grid of bitlines and wordlines, with semiconductor memory cells disposed at intersections of the bitlines and wordlines. During operation, the bitlines and wordlines are selectively asserted or negated to enable at least one of the memory cells to be read or written. The wordline decoder is coupled to the memory cells to provide a plurality of decoded data. Additionally, the bitline decoder is coupled to the memory cells to communicate data which has been decoded or will be decoded. The input/output circuit is coupled to the bitline decoder to communicate data with the bitline decoder and to determine a value which corresponds to that data.

Figure 2A:
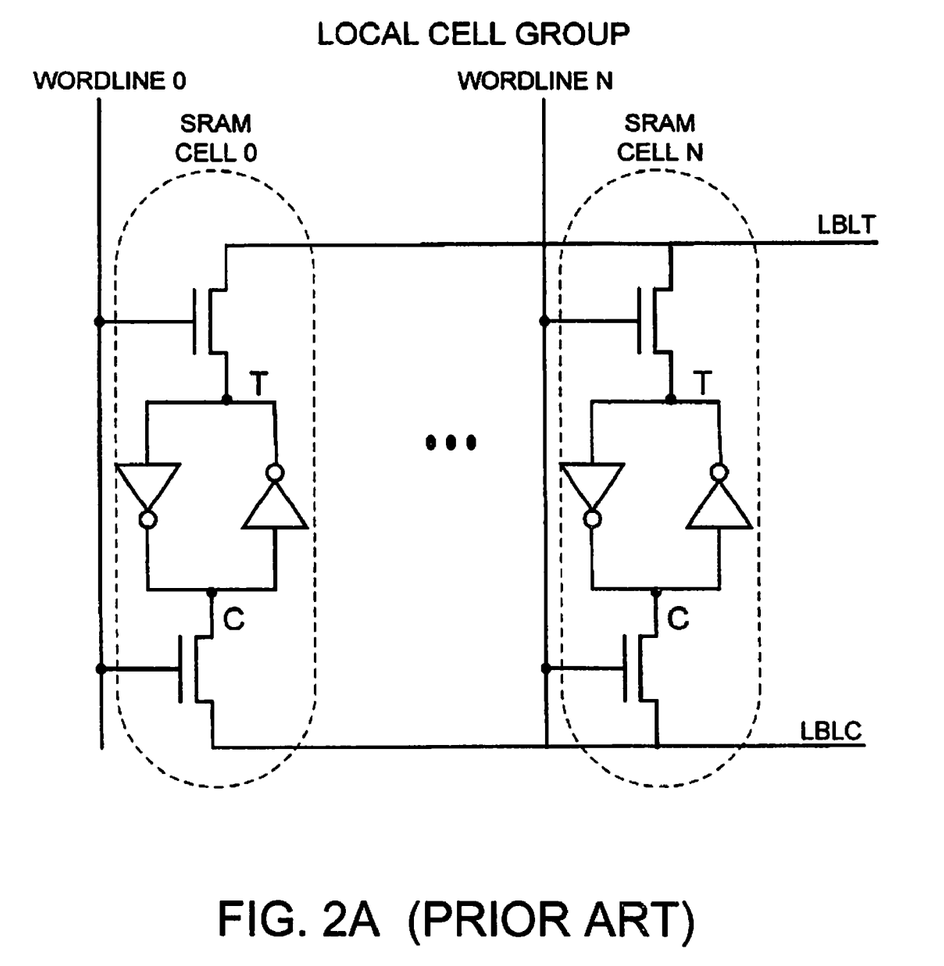
FIG. 2A is a schematic diagram illustrating a local cell group of a conventional high performance, low power domino static random access memory (SRAM).
Figure 2B:
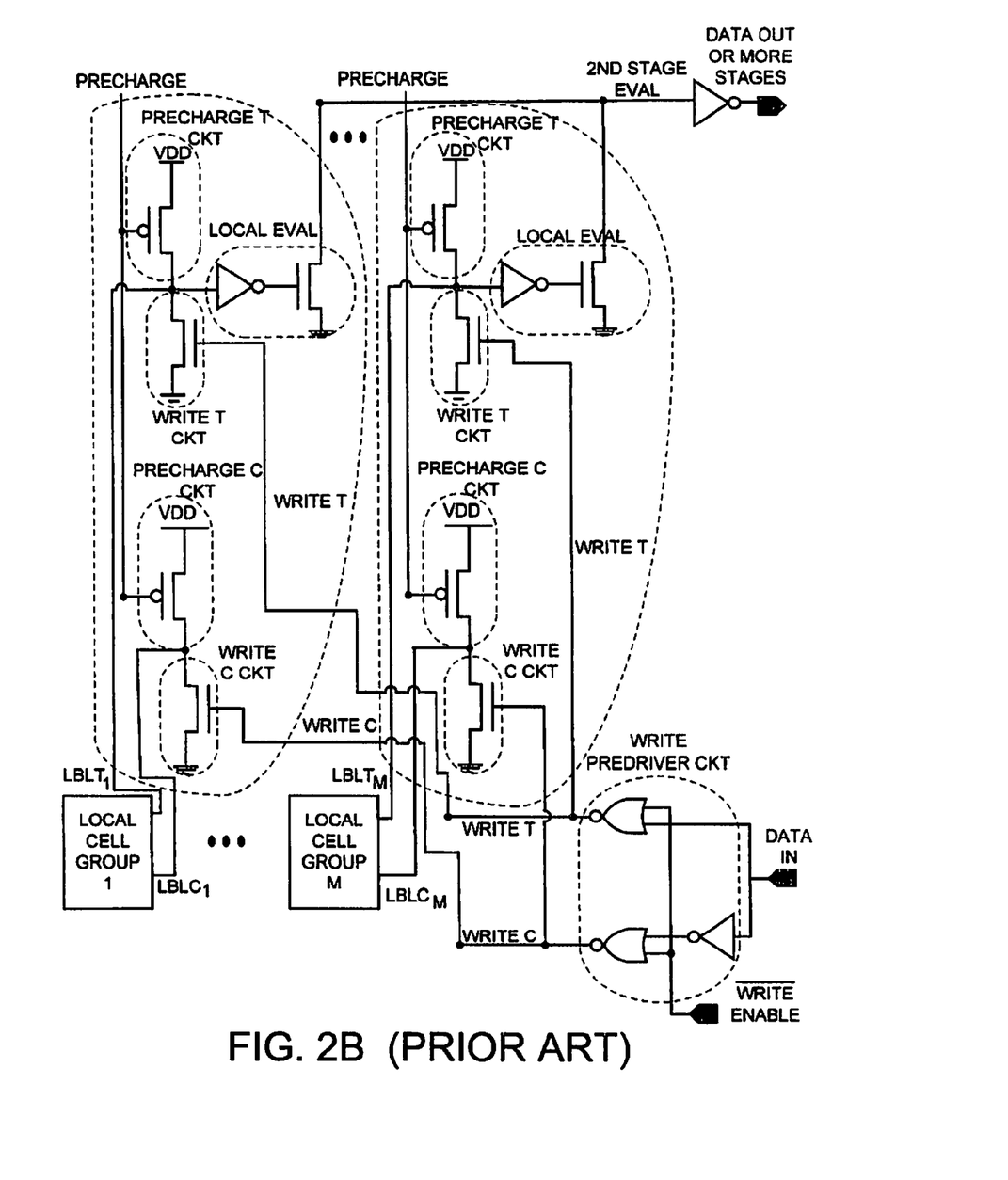
FIG. 2B is a schematic diagram illustrating circuitry of a bitline decoder of a conventional high performance, low power domino SRAM including multiple local cell groups of FIG. 2A.
Figure 2C:
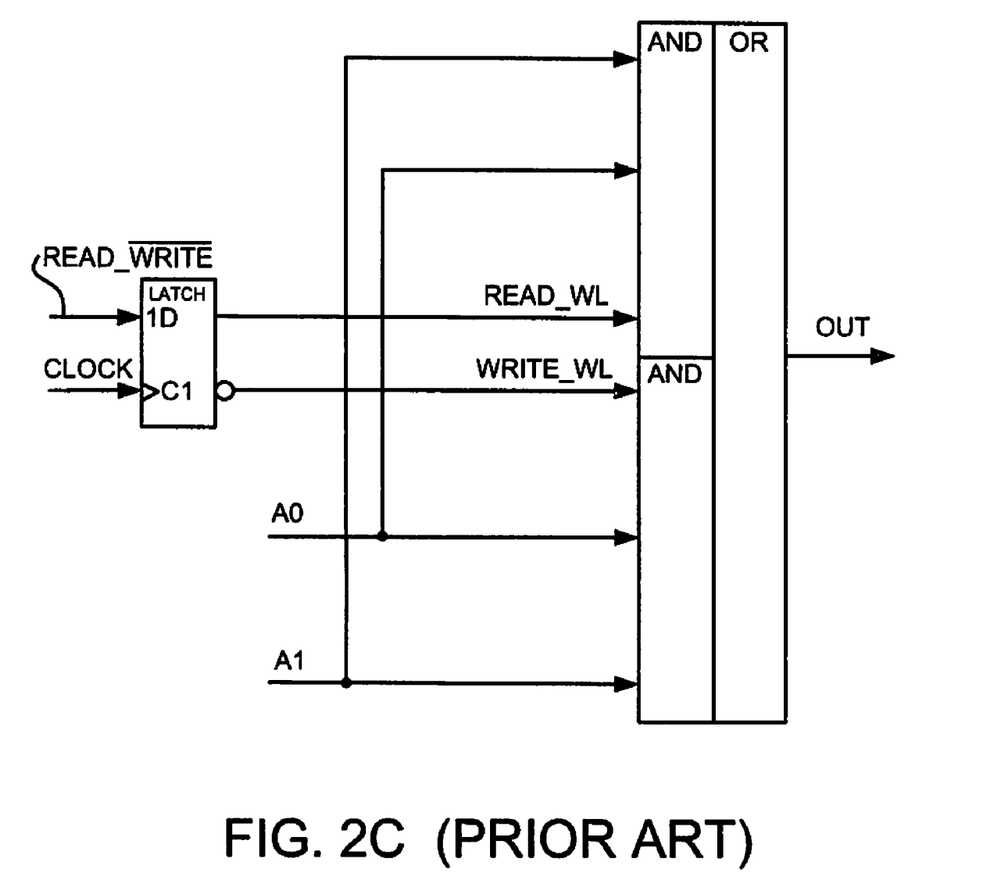
FIG. 2C is a block diagram illustrating circuitry of a wordline decoder of the conventional domino SRAM shown in FIGS. 2A and 2B.

FIGS. 2A, 2B and 2C illustrate a conventional high performance, low power domino SRAM design including multiple local cell groups. As shown in FIG. 2A, each cell group includes multiple SRAM cells 1-N and local true and complement bitlines LBLT and LBLC. Each SRAM cell includes a pair of inverters that operate together in a loop to store true and complement (T and C) data. The local true bitline LBLT and the local complement bitline LBLC are connected to each SRAM cell by a pair of wordline N-channel field effect transistors (NFETs) to respective true and complement sides of the inverters. A WORDLINE provides the gate input to the wordline NFETs. A particular WORDLINE is activated, turning on respective wordline NFETs to perform a read or write operation.

As shown in FIG. 2B, the prior art domino SRAM includes multiple local cell groups 1-M. Associated with each local cell group are precharge true and complement circuits coupled to the respective local true and complement bitlines LBLT and LBLC, write true and write complement circuits, and a local evaluate circuit. Each of the local evaluate circuits is coupled to a global bitline labeled 2ND STAGE EVAL and a second stage inverter that provides output data or is coupled to more stages. A write predriver circuit receiving input data and a write enable signal provides write true WRITE T and write complement WRITE C signals to the write true and write complement circuits of each local cell group.

A read occurs when a wordline is activated. Since true and complement (T and C) data is stored in the SRAM memory cell, either the precharged high true local bitline LBLT will be discharged if a zero was stored on the true side or the precharged high complement local bitline LBLC will be discharged if a zero was stored on the complement side. The local bitline, LBLT or LBLC connected to the one side will remain in its high precharged state. If the true local bitline LBLT was discharged then the zero will propagate through one or more series of domino stages eventually to the output of the SRAM array. If the true local bitline LBLT was not discharged then no switching through the domino stages will occur and the precharged value will remain at the SRAM output.

To perform a write operation, the wordline is activated as in a read. Then either the write true WRITE T or write complement WRITE C signal is activated which pulls either the true or complement local bitline low via the respective write true circuit or write complement circuit while the other local bitline remains at its precharged level, thus updating the SRAM cell.

As shown in FIG. 2C, a wordline decoder includes circuitry that outputs an intermediate output signal OUT to other decode circuitry (not shown) that activates the appropriate precharge and wordline signals. As mentioned earlier, the wordline signal allows access to the memory cells for reads and writes. A read wordline signal READ_WL and a write wordline signal WRITE_WL are generated as outputs of a flip-flop with a data input signal READ_WRITEBAR. The data input signal READ_WRITEBAR indicates whether a read operation or a write operation will be performed in the next cycle of a clock input signal CLOCK. The read wordline signal READ_WL and at least two address bit signals A0 and A1 are AND'd together in a decode block. In addition, the write wordline signal WRITE_WL and the at least two address bit signals A0 and A1 are AND'd together in the decode block. These two AND outputs are OR'd in the decode block to produce the intermediate output signal OUT, which proceeds through the other decode circuitry which ultimately triggers the rising edge of the precharge and the wordline signals.

Figure 3:
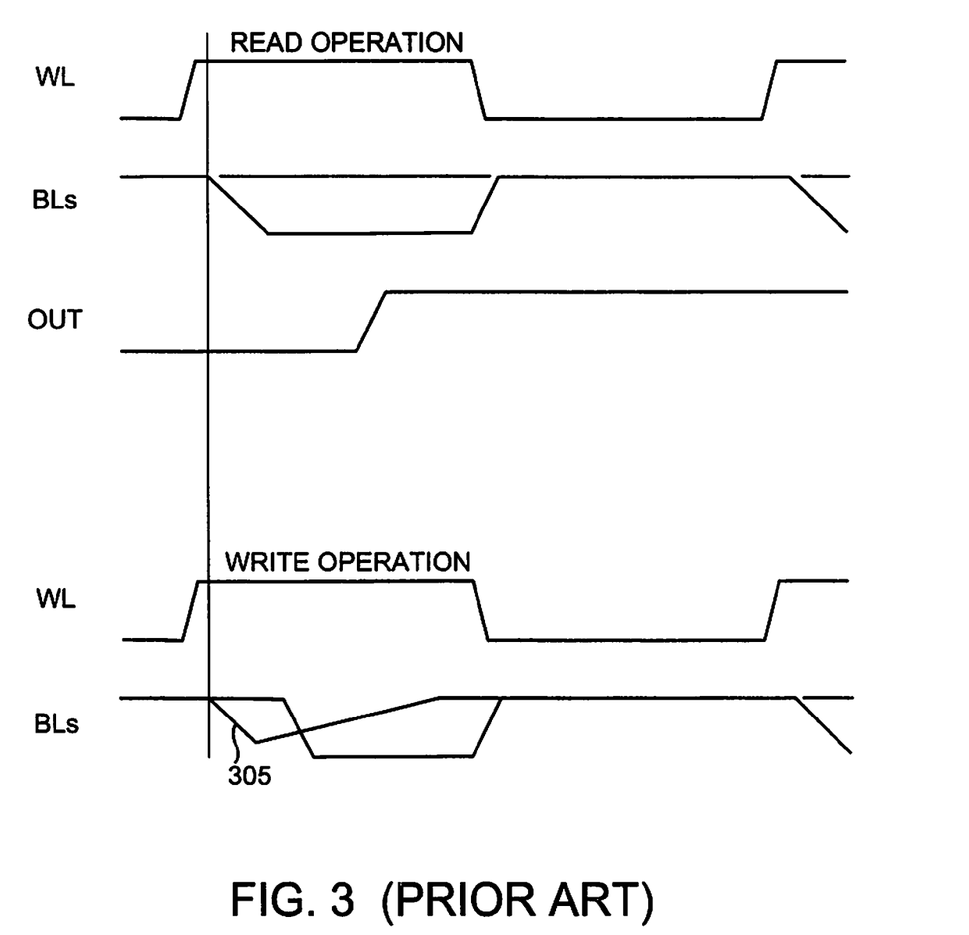
FIG. 3 is a timing diagram showing the operation of the conventional domino SRAM shown in FIGS. 2A, 2B and 2C.

FIG. 3 is a timing diagram showing the operation of the prior art domino SRAM shown in FIGS. 2A, 2B and 2C. Domino SRAM arrays, like domino logic, are governed by the behavior of the precharge cycle. Reads and writes to the SRAM cells occur during the evaluation phase when the precharge signal is high. Consequently, the wordline signal WL, which is the output of the wordline decoder and which allows access to the memory cells for reads and writes, follows the precharge signal closely. An efficient design will employ as much of the same decode/precharge/wordline circuitry as possible for both read and write operations, but a problem arises when the timing demands of a read operation and a write operation conflict. For example, a fast read path requires early rising precharge signal and wordline signal WL which can cause difficulties during a write operation. That is, if the wordline signal WL is high a significant amount of time before arrival of the write data, it is as if a read operation had commenced and a bitline signal BL (denoted with reference numeral "305" in FIG. 3) may start to fall contrary to what is required by the write data. Once this fall occurs, the bitline signal BL is slow to rise. In order for write performance to be efficient, this bitline signal BL must exhibit a profile that does not prematurely fall. Hence, the "early read" problem degrades the write performance of the domino SRAM.

Therefore, a need exists for an enhanced mechanism for handling unbalanced read/write paths in domino SRAM arrays.

SUMMARY OF THE INVENTION

According to the preferred embodiments of the present invention, a memory system, e.g., a domino static random access memory (SRAM), includes a plurality of memory cells and a wordline decoder coupled to the memory cells through a plurality of wordlines. The wordline decoder provides a wordline signal to one or more of the memory cells over one or more of the wordlines to allow access to the one or more memory cells for a read operation or a write operation. A read_wl signal and a write_wl signal are generated by the wordline decoder based on whether a read operation or a write operation is to be performed in the next cycle. The wordline decoder includes a buffer having an input for receiving the write_wl signal and an output for outputting a delayed version of the write_wl signal. The wordline signal is activated by the wordline decoder based on the read_wl signal and the delayed write_wl signal. This overcomes the "early read" problem in which write performance is degraded due to a fast read path. This solution also advantageously permits the same circuitry (e.g., decode/precharge/wordline) to be used for both the read operation and the write operation.

According to another aspect of the preferred embodiments of the present invention, the delay applied to the write_wl signal by the buffer is adjustable to match the timing requirements of the write operation.

The foregoing and other features and advantages of the invention will be apparent from the following more particular description of the preferred embodiments of the invention, as illustrated in the accompanying drawings.

BRIEF DESCRIPTION OF THE DRAWINGS

The preferred exemplary embodiments of the present invention will hereinafter be described in conjunction with the appended drawings, where like designations denote like elements.

DETAILED DESCRIPTION OF THE PREFERRED EMBODIMENTS 1.0 Overview

In accordance with the preferred embodiments of the present invention, a memory system, e.g., a domino static random access memory (SRAM), includes a plurality of memory cells and a wordline decoder coupled to the memory cells through a plurality of wordlines. The wordline decoder provides a wordline signal to one or more of the memory cells over one or more of the wordlines to allow access to the one or more memory cells for a read operation or a write operation. A read_wl signal and a write_wl signal are generated by the wordline decoder based on whether a read operation or a write operation is to be performed in the next cycle. The wordline decoder includes a buffer having an input for receiving the write_wl signal and an output for outputting a delayed version of the write_wl signal. The wordline signal is activated by the wordline decoder based on the read_wl signal and the delayed write_wl signal. This overcomes the "early read" problem in which write performance is degraded due to a fast read path. In the preferred embodiments of the present invention, this solution also advantageously permits the same circuitry (e.g., decode/precharge/wordline) to be used for both the read operation and the write operation.

In accordance with another aspect of the preferred embodiments of the present invention, the delay applied to the write_wl signal by the buffer is adjustable to match the timing requirements of the write operation.

2.0 Detailed Description

Figure 4:
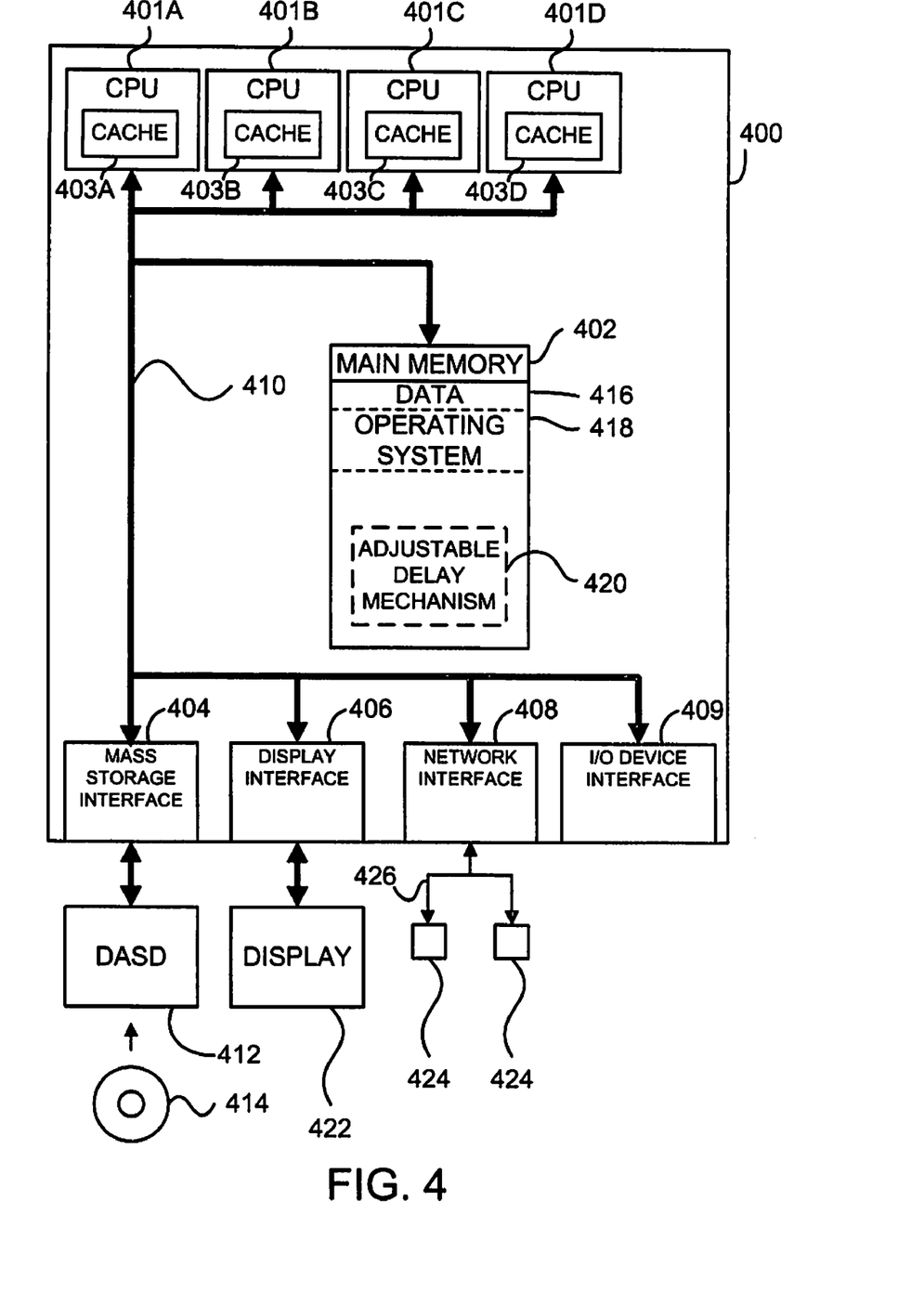
FIG. 4 is a bock diagram of a computer apparatus in accordance with the preferred embodiments of the present invention.

A computer system implementation of the preferred embodiments of the present invention will now be described with reference to FIG. 4 in the context of a particular computer system 400, i.e., an IBM eServer iSeries or System i computer system. However, those skilled in the art will appreciate that the memory system, method and computer program product of the present invention apply equally to any computer system, regardless of whether the computer system is a complicated multi-user computing apparatus, a single user workstation, a PC, or an embedded control system. As shown in FIG. 4, computer system 100 comprises a one or more processors 401A, 401B, 401C and 401D, a main memory 402, a mass storage interface 404, a display interface 406, a network interface 408, and an I/O device interface 409. These system components are interconnected through the use of a system bus 410.

FIG. 4 is intended to depict the representative major components of computer system 400 at a high level, it being understood that individual components may have greater complexity than represented in FIG. 4, and that the number, type and configuration of such components may vary. For example, computer system 400 may contain a different number of processors than shown.

Processors 401A, 401B, 401C and 401D (also collectively referred to herein as "processors 401") process instructions and data from main memory 402. Processors 401 temporarily hold instructions and data in a cache structure for more rapid access. In the embodiment shown in FIG. 4, the cache structure comprises caches 403A, 403B, 403C and 403D (also collectively referred to herein as "caches 403") each associated with a respective one of processors 401A, 401B, 401C and 401D. For example, each of the caches 403 may include a separate internal level one instruction cache (L1 I-cache) and level one data cache (L1 D-cache), and level two cache (L2 cache) closely coupled to a respective one of processors 401. However, it should be understood that the cache structure may be different; that the number of levels and division of function in the cache may vary; and that the system might in fact have no cache at all.

Note that certain aspects of the preferred embodiments of the present invention may be implemented in hardware, while other aspects may be implemented in software. For example, the memory system and method of the present invention are preferably implemented entirely in hardware, e.g., main memory 402, caches 403, and/or other memory device(s). Other aspects of the present invention, such as an adjustable delay mechanism 420, are preferably implemented at least partially in software.

Main memory 402 in accordance with the preferred embodiments contains data 416, an operating system 418 and application software, utilities and other types of software. Optionally, main memory 402 may also contain an adjustable delay mechanism 420, which as discussed in more detail below with reference to FIG. 10, implements an adjustable delay in a memory system's wordline decoder to match the timing requirements of a write operation. While the adjustable delay mechanism 420 is shown separate and discrete from operating system 418 in FIG. 4, the preferred embodiments expressly extend to adjustable delay mechanism 420 being implemented within the operating system 418. In addition, adjustable delay mechanism 420 may be implemented in application software, utilities, or other types of software within the scope of the preferred embodiments.

Computer system 400 utilizes well known virtual addressing mechanisms that allow the programs of computer system 400 to behave as if they have access to a large, single storage entity instead of access to multiple, smaller storage entities such as main memory 402 and DASD device 412. Therefore, while data 416, operating system 418, and adjustable delay mechanism 420, are shown to reside in main memory 402, those skilled in the art will recognize that these items are not necessarily all completely contained in main memory 402 at the same time. It should also be noted that the term "memory" is used herein to generically refer to the entire virtual memory of the computer system 400.

Data 416 represents any data that serves as input to or output from any program in computer system 400. Operating system 418 is a multitasking operating system known in the industry as OS/400 or IBM i5/OS; however, those skilled in the art will appreciate that the spirit and scope of the present invention is not limited to any one operating system.

According to the preferred embodiments of the present invention, adjustable delay mechanism 420 provides the functionality for implementing an adjustable delay in a memory system's wordline decoder to match the timing requirements of a write operation. Adjustable delay mechanism 420, if present, may be pre-programmed, manually programmed, transferred from a recording media (e.g., CD ROM 414), or downloaded over the Internet (e.g., over network 426).

Processors 401 may be constructed from one or more microprocessors and/or integrated circuits. Processors 401 execute program instructions stored in main memory 402. Main memory 402 stores programs and data that may be accessed by processors 401. When computer system 400 starts up, processors 401 initially execute the program instructions that make up operating system 418. Operating system 418 is a sophisticated program that manages the resources of computer system 400. Some of these resources are processors 401, main memory 402, mass storage interface 404, display interface 406, network interface 408, I/O device interface 409 and system bus 410.

Although computer system 400 is shown to contain four processors and a single system bus, those skilled in the art will appreciate that the present invention may be practiced using a computer system that has a different number of processors and/or multiple buses. In addition, the interfaces that are used in the preferred embodiments each include separate, fully programmed microprocessors that are used to off-load compute-intensive processing from processors 401. However, those skilled in the art will appreciate that the present invention applies equally to computer systems that simply use I/O adapters to perform similar functions.

Mass storage interface 404 is used to connect mass storage devices (such as a direct access storage device 412) to computer system 400. One specific type of direct access storage device 412 is a readable and writable CD ROM drive, which may store data to and read data from a CD ROM 414.

Display interface 406 is used to directly connect one or more displays 422 to computer system 400. These displays 422, which may be non-intelligent (i.e., dumb) terminals or fully programmable workstations, are used to allow system administrators and users (also referred to herein as "operators") to communicate with computer system 400. Note, however, that while display interface 406 is provided to support communication with one or more displays 422, computer system 400 does not necessarily require a display 422, because all needed interaction with users and processes may occur via network interface 408.

Network interface 408 is used to connect other computer systems and/or workstations 424 to computer system 400 across a network 426. The present invention applies equally no matter how computer system 400 may be connected to other computer systems and/or workstations, regardless of whether the network connection 426 is made using present-day analog and/or digital techniques or via some networking mechanism of the future. In addition, many different network protocols can be used to implement a network. These protocols are specialized computer programs that allow computers to communicate across network 426. TCP/IP (Transmission Control Protocol/Internet Protocol) is an example of a suitable network protocol.

The I/O device interface 409 provides an interface to any of various input/output devices.

At this point, it is important to note that while this embodiment of the present invention has been and will be described in the context of a fully functional computer system, those skilled in the art will appreciate that the present invention is capable of being distributed as a program product in a variety of forms, and that the present invention applies equally regardless of the particular type of signal bearing media used to actually carry out the distribution. Examples of suitable signal bearing media include: recordable type media such as floppy disks and CD ROMs (e.g., CD ROM 414 of FIG. 4), and transmission type media such as digital and analog communications links (e.g., network 426 in FIG. 4).

Figure 5:
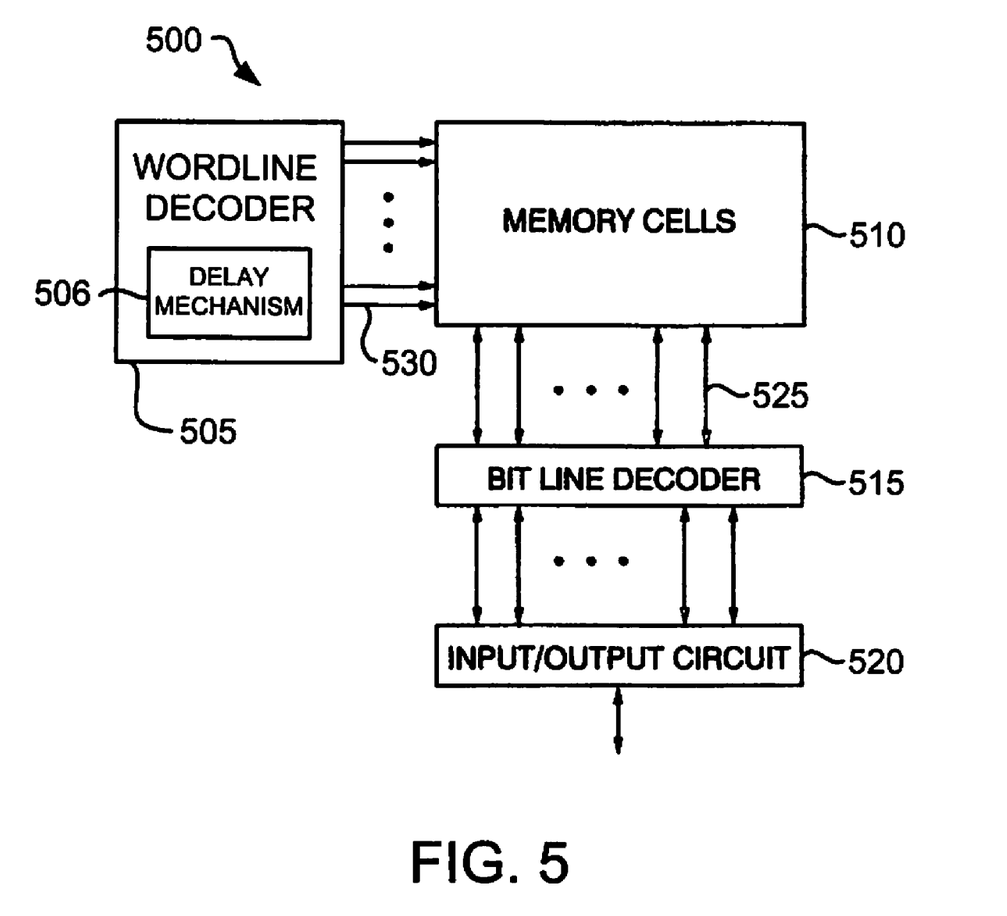
FIG. 5 is a block diagram illustrating a memory system in accordance with the preferred embodiments of the present invention.

FIG. 5 is a block diagram illustrating a memory system 500 in accordance with the preferred embodiments of the present invention. Preferably, the memory system 500 is implemented in a domino static random access memory (SRAM). However, the present invention may be implemented in other types of memory. In the preferred embodiment of the present invention shown in FIG. 5, the memory system 500 comprises a wordline decoder 505, a plurality of semiconductor memory cells 510, a bitline decoder 515, and an input/output circuit 520. The memory system 500 shown in FIG. 5 is similar to the conventional memory system shown in FIG. 1 with the exception that, as discussed in more detail below, memory system 500 adds a delay mechanism 506 to wordline decoder 505 to handle unbalanced read/write paths.

As is conventional, the semiconductor memory cells are arranged in a memory cell array having a grid of bitlines 525 and wordlines 530, with semiconductor memory cells disposed at intersections of bitlines 525 and wordlines 530. For example, the semiconductor memory cells may be arranged in local cell groups as shown in FIG. 2A. During operation, the bitlines and wordlines are selectively asserted or negated to enable at least one of the memory cells to be read or written.

The wordline decoder 505 is coupled to the memory cells 510 to provide a plurality of decoded data, as discussed in more detail below with reference to FIG. 6. As mentioned above, in accordance with the preferred embodiments of the present invention, wordline decoder 505 is provided with delay mechanism 506 for handling read and write paths that are unbalanced with respect to each other.

Additionally, bitline decoder 515 is coupled to the memory cells 510 to communicate data which has been decoded or will be decoded. The input/output circuit 520 is coupled to bitline decoder 515 to communicate data with bitline decoder 515 and to determine a value which corresponds to that data. In accordance with the preferred embodiments of the present invention, the combination of bitline decoder 515 and the input/output circuit 520 is provided by the conventional circuitry shown in FIG. 2B.

Figure 6:
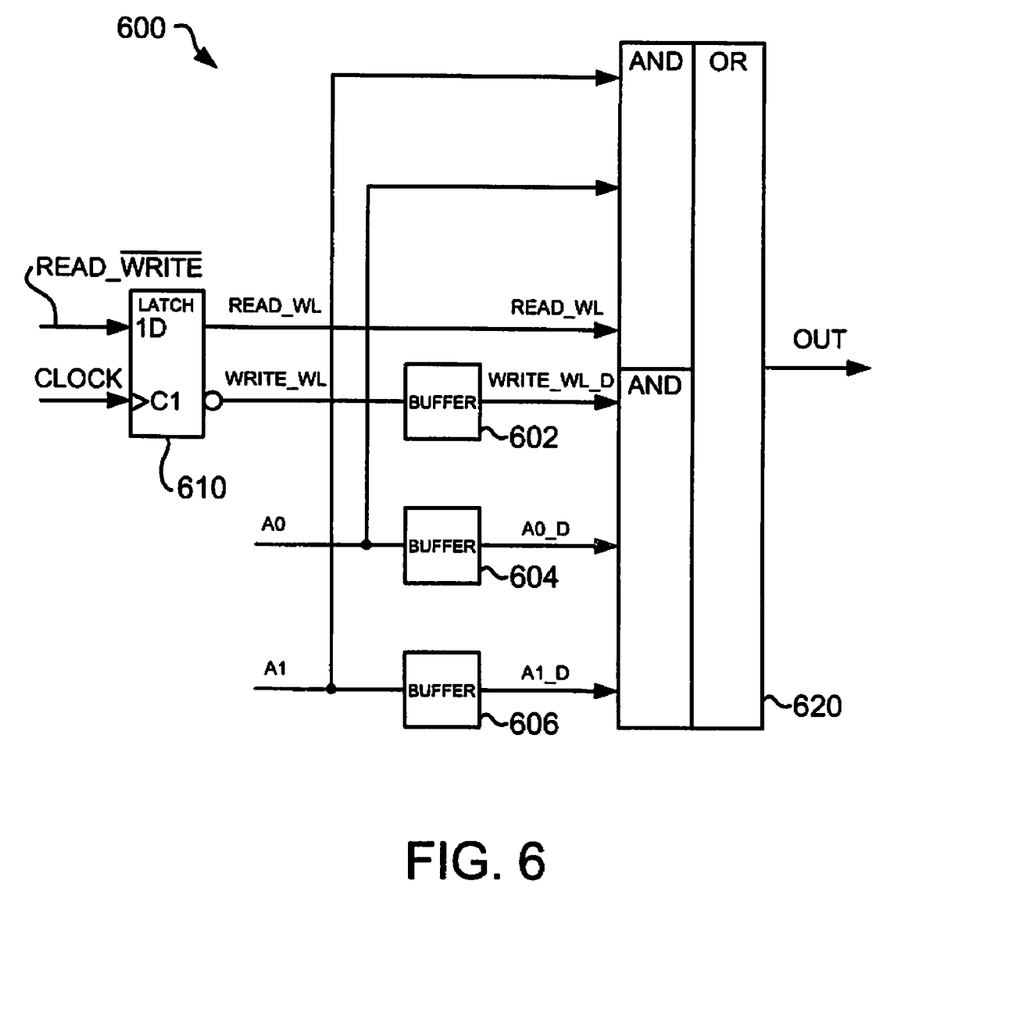
FIG. 6 is a block diagram illustrating circuitry of a wordline decoder of a domino SRAM in accordance with the preferred embodiments of the present invention.

FIG. 6 is a block diagram illustrating circuitry 600 of a wordline decoder of a domino SRAM in accordance with the preferred embodiments of the present invention. The wordline decoder's circuitry 600 shown in FIG. 6 is similar to that shown in FIG. 2C with the exception that, as discussed in more detail below, circuitry 600 adds a buffers 602, 604 and 606 to delay the signals in the write path (i.e., a write word signal WRITE_WL, an address bit signal A0, and an address bit signal A1). The buffers 602, 604 and 606 shown in FIG. 6 together correspond with the delay mechanism 506 shown in FIG. 5.

As shown in FIG. 6, in accordance with the preferred embodiments of the present invention, circuitry 600 outputs an intermediate output signal OUT to other conventional decode circuitry (not shown) that activates the appropriate precharge and wordline signals. As is conventional, a read wordline signal READ_WL and a write wordline signal WRITE_WL are generated as outputs of a flip-flop 610 with a data input signal READ_WRITEBAR. The data input signal READ_WRITEBAR indicates whether a read operation or a write operation will be performed in the next cycle of a clock input signal CLOCK.

The buffer 602 has an input for receiving the write wordline signal WRITE_WL and an output for outputting a delayed write wordline signal WRITE_WL_D, i.e., a delayed version of the write wordline signal WRITE_WL. Hence, the delayed write wordline signal WRITE_WL_D is delayed with respect to the write wordline signal WRITE_WL, as well as the read wordline signal READ_WL. Similarly, buffer 604 has an input for receiving the address bit signal A0 and an output for outputting a delayed address bit signal A0_D, i.e., a delayed version of the address bit signal A0. Likewise, buffer 606 has an input for receiving the address bit signal A1 and an output for outputting a delayed address bit signal A1_D, i.e., a delayed version of the address bit signal A1. Preferably, the delay produced by each of buffers 604 and 606 is substantially identical to that produced by buffer 602.

Three buffers are shown in FIG. 6 for the purpose of illustration. Those skilled in the art will appreciate that a different number of buffers than shown in FIG. 6 may be utilized within the scope of the present invention. For example, the number of buffers utilized may increase or decrease with the number of address bit signals utilized. Also, the buffers 602, 604 and 606 may be separate as shown in FIG. 6, or may be combined.

The delay produced by each of buffers 602, 604 and 606 is selected to provide efficient write performance in a case where the read/write paths are unbalanced. In the case of a domino SRAM with unbalanced read/write paths, for example, the delay is selected to prevent the bitline signal from prematurely falling during a write operation. This write operation timing requirement is discussed in more detail below with reference to FIG. 7.

The delay produced by each of buffers 602, 604 and 606 may be fixed, or may be adjusted based on the write operation timing requirements. In general, the buffers 602, 604 and 606 may comprise any combination of elements that produce the desired fixed or adjustable delay. An embodiment of a buffer that produces a fixed delay in accordance with the preferred embodiments of the present invention is discussed below with reference to FIG. 8. An embodiment of a buffer that produces an adjustable delay in accordance with the preferred embodiments of the present invention is discussed below with reference to FIG. 9.

As is conventional, the read wordline signal READ_WL signal, the address bit signal A0, and the address bit signal A1 are AND'd together in a decode block 620. In addition, the delayed write wordline signal WRITE_WL_D signal, the delayed address bit signal A0_D, and the delayed address bit signal A1_D are AND'd together in the decode block 620. These two AND outputs are OR'd in the decode block 620 to produce the intermediate output signal OUT, which proceeds through the other decode circuitry (not shown) that is well known in the art and which ultimately triggers the rising edge of the precharge and the wordline signals.

Figure 7:
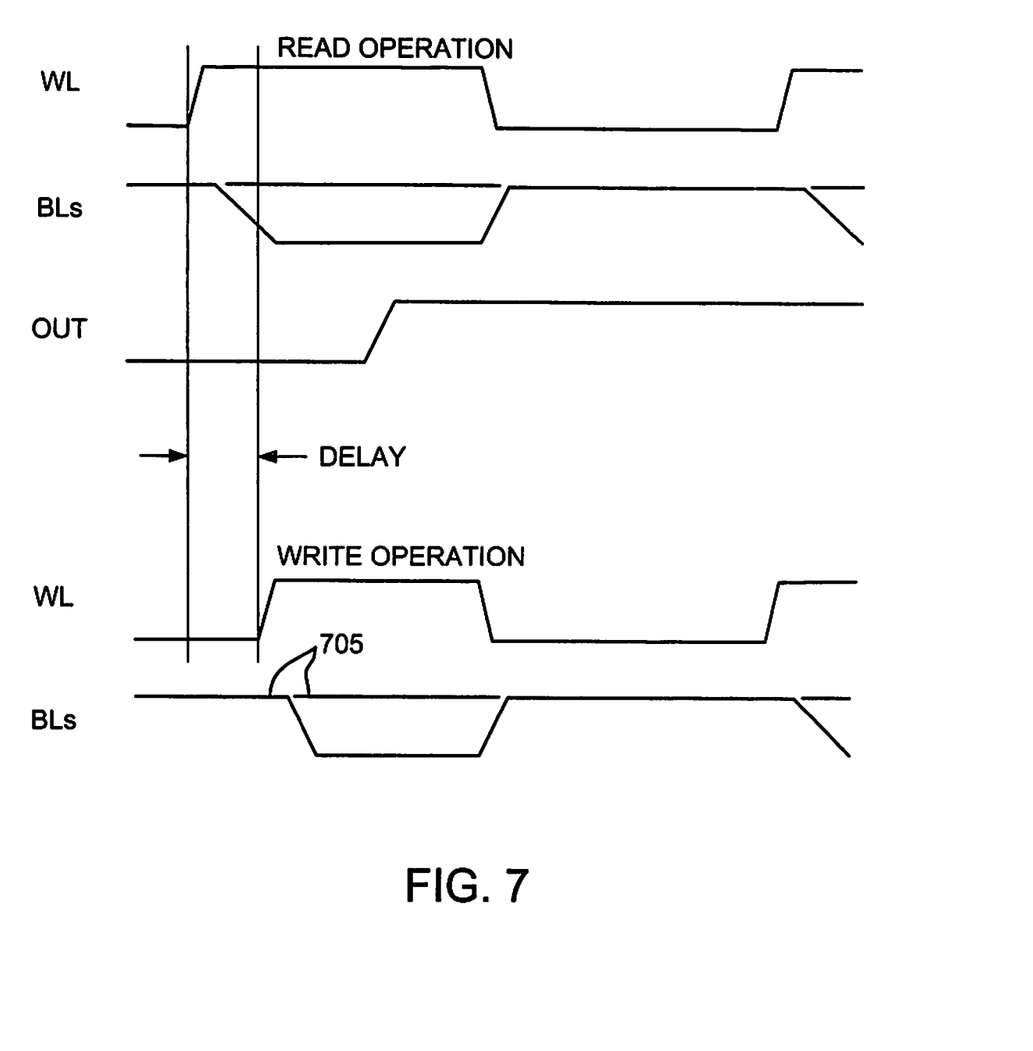
FIG. 7 is a timing diagram showing the operation of a domino SRAM in accordance with the preferred embodiments of the present invention.

FIG. 7 is a timing diagram showing the operation of a domino SRAM in accordance with the preferred embodiments of the present invention. The write operation in the timing diagram of FIG. 7 contrasts with that of FIG. 3, which is a timing diagram showing the operation of the prior art domino SRAM shown in FIGS. 2A, 2B and 2C. In FIG. 3, the bitline signal BL prematurely falls during the write operation. This "early read" problem degrades the write performance of the domino SRAM. In order for write performance to be efficient, this bitline signal BL must exhibit a profile that does not fall prematurely. As shown in FIG. 7, the delay provided by the buffers during the write operation in accordance with the preferred embodiments of the present invention prevents the bitline signal BL (denoted with reference numeral "705" in FIG. 7) from falling prematurely. In the event of a write operation, the buffers delay (as compared to the read operation) the rising edge of the precharge and wordline signals by delaying the start of the decode process. This solves the "early read" problem and enhances the write performance of the domino SRAM.

Figure 8:
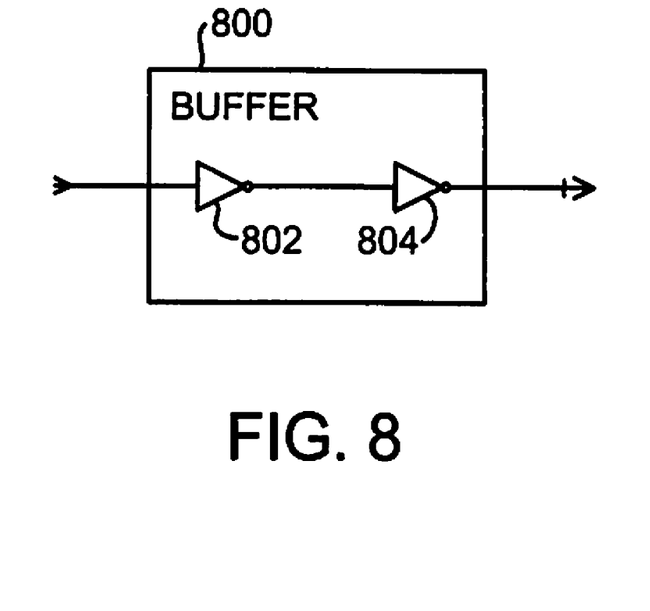
FIG. 8 is a schematic diagram of an illustrative example of a buffer having a fixed delay for the wordline decoder shown in FIG. 6.

FIG. 8 is a schematic diagram of an illustrative example of a buffer having a fixed delay for the wordline decoder shown in FIG. 6. The buffer 800 shown in FIG. 8 corresponds to a fixed delay embodiment of the buffer 602, 604 and 608 shown in FIG. 6. As shown in FIG. 8, buffer 800 in accordance with the preferred embodiments of the present invention includes at least two inverters 802, 804 connected in series.

Figure 9:
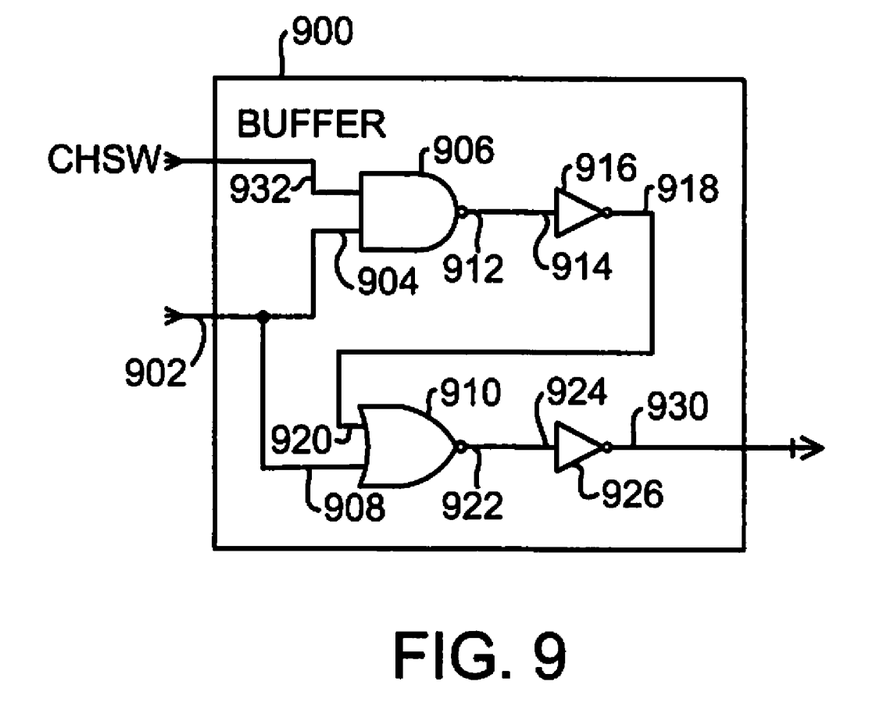
FIG. 9 is a schematic diagram of another illustrative example of a buffer having an adjustable delay for the wordline decoder shown in FIG. 6.

FIG. 9 is a schematic diagram of another illustrative example of a buffer having an adjustable delay for the wordline decoder shown in FIG. 6. The buffer 900 shown in FIG. 9 corresponds to an adjustable delay embodiment of the buffer 602, 604 and 608 shown in FIG. 6. As shown in FIG. 9, buffer 900 in accordance with the preferred embodiments of the present invention receives an input signal 902 (e.g., the write wordline signal WRITE_WL) which is coupled to one input 904 of a NAND gate 906 and one input 908 of a NOR gate 910. The output 912 of the NAND gate 906 is coupled to the input 914 of an inverter 916. The output 918 of the inverter 916 is coupled to the other input 920 of the NOR gate 910. The output 922 of the NOR gate 910 is coupled to the input 924 of an inverter 926. The output 930 of the inverter 926 provides the delayed output (e.g., the delayed write wordline signal WRITE_WL_D) the delay of which is variable based on a delay lengthening select signal input to the buffer 900. The other input 932 of NAND gate 906 receives this delay lengthening select signal CHSW, what is commonly referred to as a "safety bit" or "chicken switch" signal.

The series combination of the NOR gate 910 and the inverter 926 forms a first delay element. The series combination of the NAND gate 906 and the inverter 916 is commonly referred to as a "chicken switch" and forms a second delay element that is enabled when the delay lengthening select signal CHSW is high. Thus, when the delay lengthening select signal CHSW is low, the delay applied to the input signal 902 is merely that of the first delay element. On the other hand, when the delay lengthening select signal is high, the delay applied to the input signal 902 is the combination of both the first and second delay elements. In this way, the delay applied to the WRITE_WL and address bit signals can be adjusted to match timing requirements.

Similarly, additional chicken switches can be added to the buffer 900 to enhance the variability of the delay applied to the input signal 902. Chicken switches are well known in the art. For example, U.S. Pat. No. 6,833,736 B2, entitled "PULSE GENERATION CIRCUIT", issued on Dec. 21, 2004 to Nakazato et al., and assigned to IBM Corporation, discloses a pulse generation circuit that utilizes a chicken switch to adjust the pulse width of an input clock signal and is hereby incorporated herein by reference in its entirety.

Figure 10:
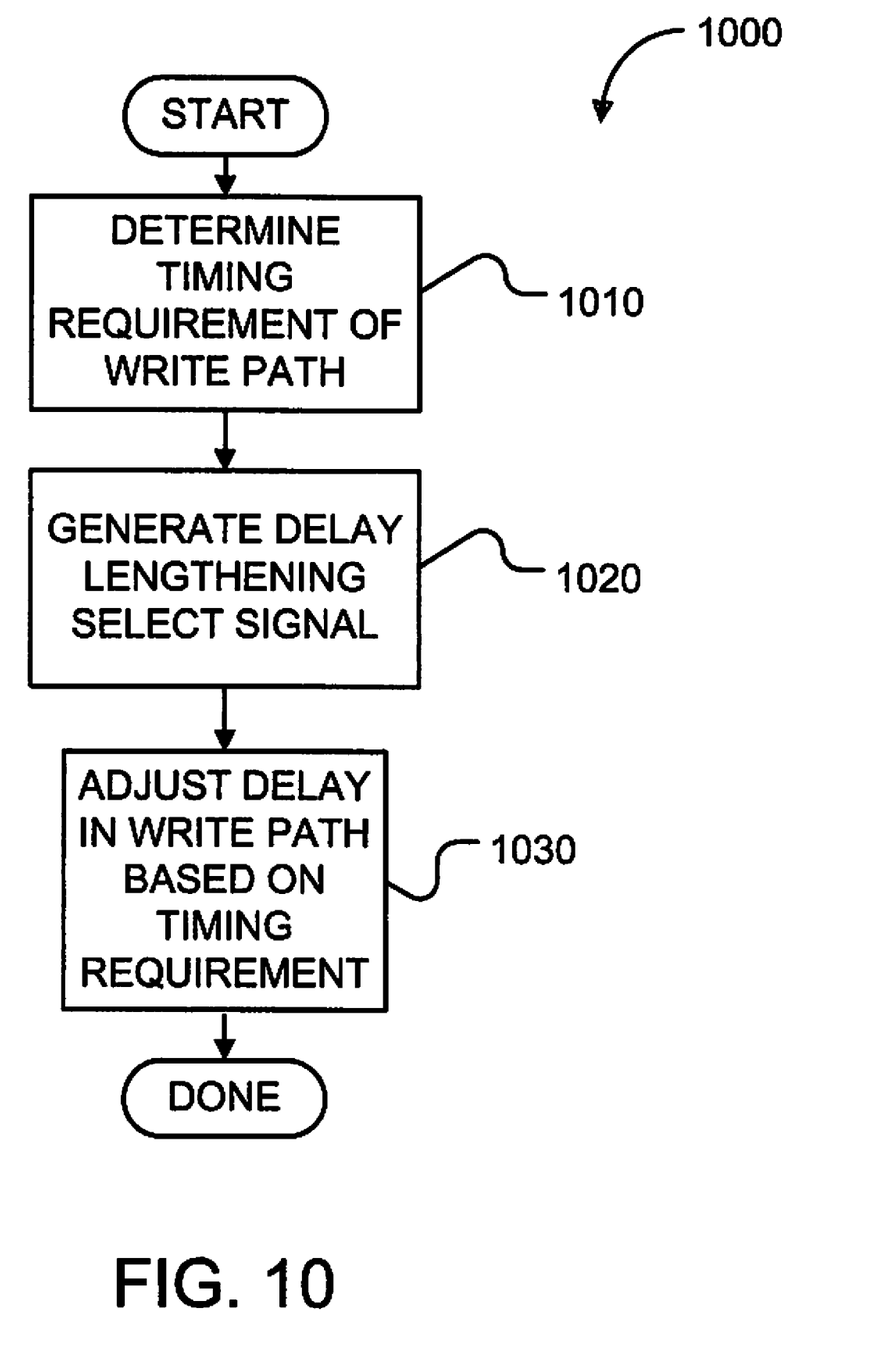
FIG. 10 is flow diagram illustrating a method for adjusting the delay of a write path of a domino SRAM in accordance with the preferred embodiments of the present invention.

FIG. 10 is flow diagram illustrating a method 1000 for adjusting the delay of a write path of a domino SRAM in accordance with the preferred embodiments of the present invention. The method 1000 shown in FIG. 10 corresponds with the adjustable delay mechanism 420 shown in FIG. 4. The method 1000 begins with the determination of write operation timing requirements (step 1010). Step 1010 may, for example, include the determination of whether or not the write performance of one or more memory cells is at or above a threshold level using a first level of delay. The method 1000 continues with the generation of an appropriate delay lengthening select signal (step 1020). Step 1020 may, for example, maintain the delay lengthening select signal at a low level if the memory cells have achieved the desired level of write performance using a first level of delay, or change the delay lengthening select signal to a high level if the memory cells have not achieved the desired level of write performance using the first level of delay. The method 1000 ends with an adjustment of the delay based on the delay lengthening select signal (step 1030).

One skilled in the art will appreciate that many variations are possible within the scope of the present invention. Thus, while the present invention has been particularly shown and described with reference to preferred embodiments thereof, it will be understood by those skilled in the art that changes in form and details may be made therein without departing from the spirit and scope of the present invention.

What is claimed is:

1. A method for implementing a domino static random access memory (SRAM), the method comprising the steps of:
  providing a plurality of SRAM cells;
  providing a wordline signal to at least one of the SRAM cells to allow access to the at least one SRAM cell for a read operation or a write operation;
  generating a read_wl signal based on whether a read operation is to be performed in the next cycle;
  generating a write_wl signal based on whether a write operation is to be performed in the next cycle;
  generating a delayed version of the write_wl signal;
  activating the wordline signal based on the read_wl signal and the delayed write_wl signal.

2. The method as recited in claim 1, further comprising the steps of:
- providing a first AND gate having inputs for receiving the read_wl signal, a first address bit signal, and a second address bit signal;
- generating a delayed version of the first address bit signal;
- generating a delayed version of the second address signal;
- providing a second AND gate having inputs for receiving the delayed write_wl signal, the delayed first address bit signal, and the delayed second address bit signal;
- providing an OR gate having inputs for receiving the output of the first AND gate and the output of the second AND gate;
- activating the wordline signal based on the output of the OR gate.

3. The method as recited in claim 1, further comprising the steps of:
- determining a write operation timing requirement;
- generating a delay lengthening select signal based on the determined write operation timing requirement;
- changing the delay of the delayed write_wl signal in response to a value of the delay lengthening select signal.

* * * * *